United States Patent [19]

Brault

[11] Patent Number: 4,665,009

[45] Date of Patent: May 12, 1987

[54] METHOD OF DEVELOPING RADIATION SENSITIVE NEGATIVE RESISTS

[75] Inventor: Robert G. Brault, Santa Monica, Calif.

[73] Assignee: Hughes Aircraft Company, El Segundo, Calif.

[21] Appl. No.: 628,948

[22] Filed: Jul. 10, 1984

[51] Int. Cl.$^4$ .............................................. G03C 5/00
[52] U.S. Cl. .................................... 430/325; 430/270; 430/331
[58] Field of Search ................... 430/331, 296, , 325, 430/27 P

[56] References Cited

U.S. PATENT DOCUMENTS

| | | | |
|---|---|---|---|
| 3,701,657 | 10/1972 | Moore et al. | 430/331 |
| 4,267,260 | 5/1981 | Miura et al. | 430/331 |
| 4,401,745 | 8/1983 | Nakane et al. | 430/296 |
| 4,405,708 | 9/1983 | Van Pelt et al. | 430/325 |

OTHER PUBLICATIONS

Taniguchi et al, Japanese Journal of Applied Physics, vol. 18, No. 6, Jun. 1979, pp. 1143–1148.
Feit et al, J. Vac. Sci. Technology, 16(3), May/Jun., 1976, pp. 944–947.
Choong et al, J. Vac. Sci. Technology, vol. 19, No. 4, Nov./Dec. 1961, pp. 1121–1126.
Imamura et al, J. Electrochem. Soc., Sep. 1979, vol. 126–129, pp. 1629–1630.
Deb et al, Die Makromolekulare Chemie. 166 (1973) pp. 227–234.

Primary Examiner—Jack P. Brammer
Attorney, Agent, or Firm—A. W. Karambelas

[57] ABSTRACT

The invention is directed to a method for obtaining a developer solvent for radiation-sensitive negative resists which are used in lithographic processes for the production of electronic microchips.

The negative resist polymer is applied to the surface of the microchip substrate directly, or through an appropriate bonding agent layer, in any conventional manner suitable to the particular polymer. Once the resist polymer coating is obtained on the substrate, the resist polymer is irradiated using a suitable radiation source to obtain a latent image therein. The latent image exists within the polymeric resist coating in the form of cross-linked polymer surrounded by areas of nonirradiated, non-crosslinked polymer which must be removed in order to develop the image, thus producing the desired resist pattern on the substrate.

Wet development of the image requires the use of solvents capable of dissolving away the non-crosslinked polymer while leaving a substantially undisturbed, undistorted crosslinked polymer image upon the substrate.

The present invention provides for use of a developer solvent comprised of a mixture of organic compounds, each of which, when applied singly, acts as a nonsolvent for such non-crosslinked polymer, but which, when applied as a mixture, works as a solvent.

Images developed using the developer solvents of the present invention are superior to images produced using development processes of the prior art in that swelling, profile distortion, surface erosion and line irregularity of the developed image are substantially eliminated.

16 Claims, 1 Drawing Figure

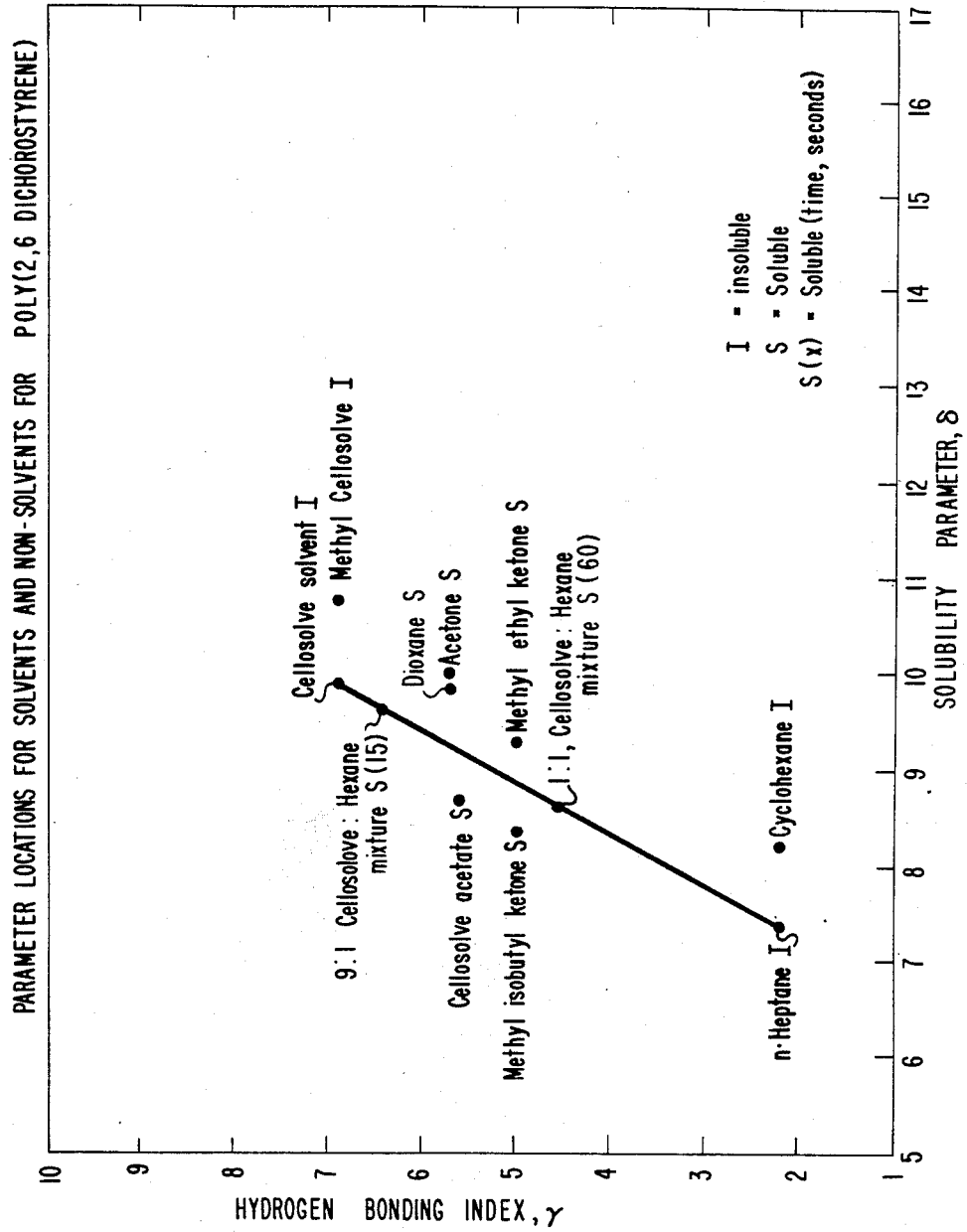

METHOD OF DEVELOPING RADIATION SENSITIVE NEGATIVE RESISTS

The Government of the United States of America has rights in this invention pursuant to Contract No. N00019-80-C-0616 awarded by the Department of the Navy.

BACKGROUND OF THE INVENTION

This invention provides a method of developing radiation sensitive negative resists in a manner which produces a developed resist free from swelling, profile distortion and line distortion.

The resist polymer is applied to the surface of the semiconductor wafer using one of the standard methods of application such as spin coating. The film of resist polymer covering the semiconductor surface is then exposed to radiation from a source such as electron beam, ion beam, or X-ray in order to create the desired resist pattern or image within the film. In the case of a negative resist, the pattern is in the form of a crosslinked polymer which is less soluable than the surrounding nonexposed polymeric material. The pattern or image is subsequently developed by removal of the more soluble, nonexposed polymeric film via use of a solvent.

When images with narrow lines, especially lines less than one micrometer in width, such as those created by electron beam exposure, are developed in negative resists, there is a pronounced tendency for the lines and edges to undergo a characteristic sinusoidal deformation that can be named "snaking." Other observers have described this line phenomenon as "sinuous lines," or "scriggily lines, or wavy lines." These snaky lines form lateral filaments, in some instances which cause bridging of the adjacent lines; in severe cases, snaky lines may not only bridge but merge.

It has been observed that the developed negative resist is swollen and is thicker (higher) than the thickness (elevation) of the initial resist layer. This increased thickness may introduce undesirable anomalies into the developed resist; a developed resist having substantially the thickness of the initial resist layer is preferred.

The article, "Three Dimensional Behavior of Negative Electron Resists" by R. D. Heindenreich and G. W. Kammlott, *Polymer Engineering and Science,* June 1977, Vol. 17, No. 6. pp. 377–380, is concerned with the influence of swelling in the exposed (irradiated) resist during solvent developing. The polymer used was poly(glycidyl methacrylate-co-ethyl acrylate) (PGMA-co-EA). The developer was a solution mixture of methyl ethyl ketone and ethanol; two proportions were used: 5 MEK:2 ethanol and 5 MEK:1.5 ethanol. The development was by immersion. When the 5:2 solution was immediately followed by the 5:1.5 solution, the exposed resist developed lines were very scriggily. It was concluded that the poor edge definition of the developed resist is the result of swelling of partially crosslinked polymer during exposure to the liquid developer.

The article, "Sol-Gel Behavior and Image Formation in Poly(glycidyl methacrylate) and Its Copolymers with Ethyl Acrylate," by E. D. Feit, M. E. Wurtz and G. W. Kammlott, *Journal of Vacuum Science and Technology,* 15(3), May/June 1978, pp. 944–947, is concerned with the interaction of the resist and the liquid developer. Seven samples of Poly(glycidyl methacrylate) (PGMA) and eight samples of P(GMA-co-EA) were tested, using a scanning electron beam radiation source. The developer was a solution mixture of ketone and alcohol (species not specified) in proportions ranging from 3:1 to 9:1. In some instances, a high ratio solution immersion was followed by a lower ratio solution immersion. Owing to the swelling of the resist during development, lines deformed and assumed a sinusoidal appearance. It was concluded that faithful reproduction in the resist of a feature written by the electon beam does not depend on molecular parameters of the polymer alone, but rather on factors such as solvent induced swelling, competitive wetting of the substrate and of the polymer by the solvent, and gel rupture by forced development.

The article, "PGMA as a High Resolution, High Sensitivity Negative Electron Beam Resist", by Yoshio Taniguchi et al, *Japanese Journal of Applied Physics,* Vol. 18, No. 6, June 1979, pp. 1143–1148, is concerned with comparing resist material and concludes that PGMA is, under appropriate conditions, an excellent resist material. The samples were electron beam exposed; the development was by immersion or spraying with a solution mixture of methyl ethyl ketone and ethanol. The developed samples were rinsed for sixty seconds in methyl isobutyl ketone. The optimum developer was 6:1–10:1 solution mixture, with an immersion time of 180 seconds (40 seconds by spraying). It was observed that some resists showed line deformation, referred to as "rough edges", which was attributed to post-baking temperatures.

The article, "Chloromethylated Polystyrene as a Dry-Etch-Resistant Negative Resist for Submicron Technology," by Saburo Imamura, *Journal of Electrochemical Society,* Vol. 126, No. 9, September 1979, pp. 1628–1630, is concerned with a new resist material, chloromethylated polystyrene (CMS). As a resist material, CMS was irradiated with X-rays and with deep UV-radiation. The exposed CMS resist was developed by dipping into n-amyl acetate solvent for thirty seconds, and then rinsed in isopropyl alcohol for sixty seconds. No mention is made of resist line or edge deformation.

The article, "Molecular Parameters and Lithographic Performance of Poly(chloromethylstyrene)—A High Performance Negative Electron Resist," by H. S. Choong and F. J. Kahn, *Journal of Vacuum Science and Technology,* 19(4), Nov/Dec 1981, pp. 1121–1126, is concerned with locating a resist material that is the equivalent of the chloromethylated polystyrene of Imamura (above). It is considered that the alkylation agent of Imamura is carcinogenic. It was found that the poly(chloromethylstyrene) polymer was equal to the Imamura polymer. The tests were carried out by exposing the resist with a scanning electron beam. The exposed resist was developed by dipping into n-pentyl acetate, followed by an isopropyl alcohol rinse (as was done by Imamura). It was observed that developed lines were wavy and showed some bridging, attributed to resist swelling and the proximity of the lines.

In U.S. patent application, Ser. No. 491,636, by Robert G. Brault and Leroy J. Miller, mixtures of a good solvent combined with a poor or nonsolvent are utilized to develop the image in order to reduce distortion of the developed image. After development, the imaged polymer is rinsed with a material which is a nonsolvent for the polymer, but which has affinity for the developer solvent. Use of such rinse reduces the amount of residual developer solvent in the image polymer and thus minimizes the distortion of the developed image from the initial image prior to development.

P. C. Deb and S. R. Palit reported the use of a mixture of two nonsolvents to dissolve a polymer in *Makromolekulare Chemie*, 166, 1973, pp. 227–234. They found that poly(methylmethacrylate) (PMMA) can be dissolved in a mixture of the two nonsolvents, carbon tetrachloride and methyl alcohol, and suggest mechanisms to explain the phenomenon. However, there is no comment concerning use of a mixture of two nonsolvents to dissolve crosslinked polymers. There is no mention of possible use of such nonsolvent mixtures in lithographic processes.

The present invention provides a further improvement in the wet development of irradiated negative resists, so that a developed image is produced which is substantially undistorted from the initial image prior to development.

SUMMARY OF THE INVENTION

Accordingly, the primary purpose of this invention is to provide a method for obtaining a developer solvent for radiation-sensitive negative resists which provides dissolution of the non-crosslinked resist polymer, but which exhibits limited diffusion into the crosslinked resist polymer. Diffusion into the crosslinked resist polymer must be limited such that swelling, profile distortion, surface erosion and line irregularity of the developed image are substantially eliminated.

In accordance with the invention, the nonexposed, non-crosslinked polymer is removed by applying a mixed developer solvent comprised of at least two organic compounds, each of which, when applied singly, is a nonsolvent for such non-crosslinked polymeric material, but which, when applied as a mixture, works as a solvent.

BRIEF DESCRIPTION OF THE DRAWING

The sole FIGURE is a graph showing the relative solubility of poly(2,6 dichlorostyrene) in various solvents, particularly as correlated with the solubility parameter, $\delta$, and the hydrogen bonding index, $\gamma$.

DETAILED DESCRIPTION OF THE INVENTION

The submicron lithographic process of the invention utilizes a negative resist polymer positioned on a suitable substrate. Illustrative substrates are glassy materials such as silicon oxide, glass, polyimides, ceramics, metals, and semiconductors such as silicon and III–V materials (such as GaAs).

The negative resist polymer of the wet submicron lithographic process of the invention is selected from the group consisting of: (a) polystyrene; (b) halogenated polystyrene; and (c) substituted styrene polymer having at least one substituent, where the substituent(s) is selected from the group consisting of alkyl having 1–4 carbon atoms, halo, and haloalkyl having 1–4 carbon atoms and at least one halo, and mixtures thereof.

The negative resist polymer is applied to the surface of the substrate directly, or through an appropriate bonding agent layer, in any conventional manner suitable to the particular polymer, to obtain a resist polymer coating on the substrate (normally a wafer).

The resist polymer is irradiated in the desired pattern to obtain a latent image therein, by any suitable means such as electron beam, ion beam, X-ray, or U.V. radiation.

Irradiation of the negative resist polymer produces a latent image in the desired pattern. The latent image exists within the polymer film in the form of crosslinked polymer surrounded by areas of nonirradiated, non-crosslinked polymer. The latent image is developed by treatment with a developer solvent which dissolves the non-crosslinked polymer leaving the crosslinked polymer image on the surface of the substrate.

In order to obtain a developed image which has not been swelled nor distorted by the development process, it is necessary that the developer solvent dissolve the non-crosslinked polymer without diffusing into the crosslinked polymer. Accordingly, it has been discovered that when the developer solvent is comprised of at least two organic compounds, each of which, when applied singly, is a nonsolvent for the non-crosslinked polymer, but which together are a solvent for such non-crosslinked polymer, swelling of the developed resist is substantially reduced, indicating that diffusion of such developer solvent into the crosslinked polymer image is also substantially reduced.

Relative solubility of polymers in various solvents has been correlated to several factors. Two of these factors are the solubility parameter, $\delta$, and the hydrogen bonding index, $\gamma$. Delta is derived from thermodynamics and is related to the molar heat of vaporization. Gamma is an arbitrary scale which relates to the ability of a solvent to form hydrogen bonds. Thus, hydrocarbons have low $\gamma$ values while alcohols have relatively high $\gamma$ values. Lists of $\delta$ and $\gamma$ values for solvents are readily available in the literature. The $\delta$ and $\gamma$ values for polymers can be determined by ordinary and standard experimentation, by determining the relative solubility of the polymer in different solvents. Values of $\delta$ and $\gamma$ intermediate between those of pure solvents may be determined utilizing a mixture of solvents. The sole FIGURE is a graph showing the relative solubility of poly(2,6-dichlorostyrene), a negative resist, in various solvents. The solubilities are expressed in terms of the solubility parameter, $\delta$, and the hydrogen bonding index, $\gamma$. It was determined that the poly(2,6dichlorostyrene) was insoluble in cellosolve ($\delta=9.9$, $\gamma=6.9$) and insoluble in methyl cellosolve ($\delta=10.2$, $\gamma=6.9$). Poly(2,6 dichlorostyrene) was also determined to be insoluble in n-heptane ($\delta=7.3$, $\gamma=2.2$) and cyclohexane ($\delta=8.2$, $\gamma=2.2$). However, the poly(2,6 dichlorostyrene) was found to be soluble within 60 seconds in a 1:1 mixture of cellosolve:heptane ($\delta=8.7$, $\gamma=4.5$) and within 15 seconds in a 9:1 mixture of cellosolve:heptane ($\delta=9.6$, $\gamma=6.4$).

Similar observations were made for other negative resist polymers such as poly(4-chlorostyrene) and poly(4-bromostyrene) which were discovered to be insoluble in individual solvents but soluble in mixtures of such solvents.

Images produced using poly(2,6 dichlorostyrene) or poly(4-chlorostyrene) resist wherein the developer solvent was comprised of at least two organic materials, each of which, when applied singly, is a nonsolvent for the non-crosslinked polymer, were superior to images produces when the developer solvent was a good solvent for the resist and a nonsolvent rinse was used to remove excess developer solvent from the crosslinked polymer image (the technique used in the process described in U.S. patent application, Ser. No. 491,634, previously discussed). It is possible to use a nonsolvent rinse to remove excess developer solvent when the developer solvent has been comprised of a mixture of two nonsolvents in accordance with the process of the present invention. When this is done, the nonsolvent rinse is preferably an alkane or cycloalkane. There may be a benefit to using a nonsolvent rinse when the developer solvent has a greater tendency to diffuse into the crosslinked polymer image, for example, in cases of lower molecular weight resists or resists having a lower density of crosslinking.

The discussion above describes the use of developer solvents comprised of a mixture of at least one alcohol and at least one alkane or cycloalkane. It was discovered that alcohols wherein the alcohol molecule contained no ether group could not be combined with the alkane or saturated aromatic molecule to produce a developer solvent for halogenated polystyrene negative resists; alcohols wherein the alcohol molecule contained one ether group could be used to produce a developer solvent mixture; and alcohols wherein the alcohol molecule contained at least two ether groups were frequently solvents individually for the halogenated polystyrene negative resist.

Examples of alcohols wherein the alcohol molecule contains one ether group include 2-methoxyethanol, 2-ethoxyethanol, 2-methoxypropanol, 3-methoxypropanol, 3-ethoxypropanol, and 3-ethoxypropanol. Such examples are not all inclusive, and one skilled in the art can produce a long listing of alcohol molecules containing one ether group which should perform adequately. The following table contains a listing of developer solvent mixtures and dissolution times for some of the halogenated polystyrene resists.

dry nitrogen. The lines which had been exposed to a dose of 60 μC/cm and which made up the patterned image after development looked straight, and the cross-sectional profile was undistorted from the image prior to development. The developed image from the above process appeared to be better than those developed using a good solvent such as cellosolve acetate and subsequently rinsed using a cellosolve/isopropyl alcohol mixture. The latter development process is illustrative of the method described in U.S. patent application, Ser. No. 491,636, discussed earlier.

Example 2

A silicon wafer coated with a 8,800 Å thick film of poly(4-chlorostyrene) was exposed to a scanning electron beam at a series of increasing dosages and developed using a mixture of ethoxyethanol/methylcyclohexane. The imaged resist film upon the wafer substrate was immersed in a 1:1 mixture of ethoxyethanol-methylcyclohexane and then blown dry using dry nitrogen. The lines which had been exposed to a dose of 2.51 μC/cm and which made up the patterned image after development were straight when observed under the optical microscope. Previous experience had shown that development of this same resist with a good solvent such as ethoxy ethylacetate followed by use of nitrogen to blow dry the resist surface resulted in sinuous, wavy lines.

While the invention has been described with reference to its preferred embodiments, it will be understood by those skilled in the art that various changes may be

TABLE I

Solubility Data for Halogenated Polystyrene Negative Resists

| RESIST POLYMER | DEVELOPER SOLVENT MIXTURE | | DEVELOPMENT TIME REQUIRED |
|---|---|---|---|
| | Ratio | Composition | Seconds |
| Poly(2,6 dichlorostyrene) | 0:1 | *2-ethoxyethanol:n-heptane | Insoluble |
| | 1:1 | 2-ethoxyethanol:n-heptane | 60 |
| | 9:1 | 2-ethoxyethanol:n-heptane | 15 |
| | 1:0 | 2-ethoxyethanol:n-heptane | Insoluble |
| | 9:1 | **2-methoxyethanol:n-heptane | 20 |
| Poly(4-chlorostyrene) | 0:1 | 2-ethoxyethanol:methylcyclohexane | Insoluble |
| | 1:1 | 2-ethoxyethanol:methylcyclohexane | 30 |
| | 1:0 | 2-ethoxyethanol:methylcyclohexane | Insoluble |
| | 0:1 | 3-methoxypropanol:cyclohexane | Insoluble |
| | 1:1 | 3-methoxypropanol:cyclohexane | 15 |
| | 1:0 | 3-methoxypropanol:cyclohexane | Insoluble |
| | 0:1 | 2-methoxyethanol:cyclohexane | Insoluble |
| | 5:95 | 2-methoxyethanol:cyclohexane | Insoluble |
| | 1:1 | 2-methoxyethanol:cyclohexane | Insoluble |
| | 95:5 | 2-methoxyethanol:cyclohexane | 60 |
| | 1:0 | 2-methoxyethanol:cyclohexane | Insoluble |

*2-ethoxyethanol is also known as "Cellosolve"
**2-methoxyethanol is also known as "Methyl Cellosolve"

EXAMPLES

Example 1

A silicon wafer coated with a 2,500 Å thick poly(2,6-dichlorostyrene) negative resist was exposed with a scanning electron beam at a series of increasing dosages to produce images and these images were developed using a mixture of 2-ethoxyethanol/n-heptane. The imaged resist film upon the wafer substrate was immersed in a 9:1 mixture of ethoxy ethanol:heptane for 20 seconds followed by a second immersion into a fresh mixture of the same solvents (at the same ratio) for a period of ten seconds. While the developed resist was still wet, it was rinsed for 30 seconds with heptane to remove any of the solvent mixture remaining on the surface of the resist; then the resist was blown dry with made in the negtive resist polymer to be developed and equivalents may be substituted for the organic compounds making up the developer solvent without departure from the true spirit and scope of the invention.

What is claimed is:

1. An improved lithographic process for preparing a patterned resist on a substrate wherein a layer of negative resist polymer is applied to a substrate, said polymber being selected from the group consisting of polystyrene, halogenated polystyrene, and substituted styrene polymer having at least one substituent independently selected from the group consisting of alkyl having 1-4 carbon atoms, halo, haloalkyl having 1-4 carbon atoms and at least one halo, and mixtures thereof, irradiating said resist polymer layer to form an image therein, and developing said resist image by using a developer solvent to remove non-irradiated, non-crosslinked resist polymer from the substrate, wherein the improvement comprises:

using a developer solvent consisting essentially of at least two organic compounds wherein the first organic compound is a molecule having at least one hydroxyl group and only one ether group and wherein the second organic compound is selected from the group consisting of alkanes and cycloalkanes, each organic compound when applied singly, is a nonsolvent for said non-irradiated, non-crosslinked resist polymer, but which, when combined into a mixture, act as a solvent for said non-irradiated, non-crosslinked resist polymer.

2. The process of claim 1 wherein said first organic compound is selected from the group consisting of 2-methoxyethanol, 2-ethoxyethanol, 2-methoxypropanol, 3-methoxypropanol, 2-ethoxypropanol and 3-ethoxypropanol.

3. The process of claim 1 wherein said developer solvent consists essentially of a mixture containing at least one first organic compound selected from the group consisting of 2-methoxyethanol, 2-ethoxyethanol, 2-methoxypropanol, 3-methoxypropanol, 2-ethoxypropanol and 3-ethoxypropanol combined with at least one second organic compound selected from the group consisting of n-heptane, cyclohexane, and methylcyclohexane.

4. The process of claim 1 wherein subsequent to development of said resist image using said developer solvent, the wet developed image is rinsed with a nonsolvent.

5. The process of claim 4 wherein said rinse nonsolvent is selected from the group consisting of alkanes and cycloalkanes.

6. A lithographic process for preparing a patterned resist on a substrate, said process comprising the steps of:
(a) applying a layer of negative resist polymer onto a substrate, said polymer being selected from the group consisting of
(i) halogenated polystyrene;
(ii) substituted styrene polymer having at least one substituent, wherein said substituent is selected from the group consisting of halo, and haloalkyl having 1-4 carbon atoms and at least one halo; and
(iii) mixtures thereof;
(b) irradiating said resist polymer layer to form a negative pattern image therein; and
(c) developing said image by dissolving away unexposed polymer with a developer solvent consisting essentially of at least two organic compounds, wherein the first organic compound is a molecule having at least one hydroxyl group and only one ether group and wherein the second organic compound is selected from the group consisting of alkanes and cycloalkanes, each organic compound when applied singly, is a nonsolvent for said non-irradiated, non-crosslinked resist polymer, but which, when combined into a mixture, act as a solvent for said non-irradiated, non-crosslinked resist polymer.

7. The process of claim 6 wherein said first organic compound is selected from the group consisting of 2-methoxyethanol, 2-ethoxyethanol, 2-methoxypropanol, 3-methoxypropanol, 2-ethoxypropanol and 3-ethoxypropanol.

8. The process of claim 7 wherein said developer solvent consists essentially of a mixture containing at least one first organic compound selected from the group consisting of 2-methoxyethanol 2-ethoxyethanol, 2-methoxypropanol, 3-methoxypropanol, 2-ethoxypropanol and 3-ethoxypropanol combined with at least one second organic compound selected from the group consisting of n-heptane, cyclohexane, and methylcyclohexane.

9. A lithographic process for preparing a patterned resist on a substrate which process comprises:
(a) applying a layer of negative resist polymer onto a substrate, said polymer being selected from the group consisting of:
(i) halogenated polystyrene;
(ii) substituted styrene polymer having at least one substituent, wherein said substituent is selected from the group consisting of halo, and haloalkyl having 1-4 carbon atoms and at least one halo; and
(iii) mixtures thereof;
(b) irradiating said resist polymer layer to form a negative pattern image therein;
(c) developing said image by dissolving away unexposed polymer with a developer solvent wherein said developer solvent consists essentially of at least two organic compounds, wherein the first organic compound is a molecule having at least one hydroxyl group and only one ether group and wherein the second organic compound is selected from the group consisting of alkanes and cycloalkanes, each of organic compound when applied singly, is a nonsolvent for said non-irradiated, non-crosslinked resist polymer, but which, when combined into a mixture, act as a solvent for said non-irradiated, non-crosslinked resist polymer; and
(d) rinsing the wet developed image of step (c) with a nonsolvent to remove residual developer solvent.

10. The process of claim 9 wherein said rinse nonsolvent used to remove said residual developer solvent is selected from the group consisting of alkanes and cycloalkanes.

11. The process of claim 9 wherein said first organic compound is selected from the group consisting of 2-methoxyethanol, 2-ethoxyethanol, 2-methoxypropanol, 3-methoxypropanol, 2-ethoxypropanol and 3-ethoxypropanol.

12. The process of claim 1 wherein the developer solvent consists essentially of an organic compound having at least one hydroxyl group and only one ether group and an alkane in a 9:1 ratio.

13. The process of claim 1 wherein the developer solvent consists essentially of an organic compound having at least one hydroxyl group and only one ether group and a cycloalkane in a 1:1 ratio.

14. The process of claim 1 wherein the developer solvent is 2-ethoxyethanol:n-heptane in a 9:1 ratio.

15. The process of claim 1 wherein the developer solvents is 2-methoxyethanol:n-heptane in 9:1 ratio.

16. The process of claim 1 wherein the developer solvent is 3-methoxypropanol:cyclohexane in a 1:1 ratio.

* * * * *

UNITED STATES PATENT AND TRADEMARK OFFICE
CERTIFICATE OF CORRECTION

PATENT NO.  : 4,665,009
DATED       : May 12, 1987
INVENTOR(S) : Robert G. Brault It is certified that error appears in the above-identified patent and that said Letters Patent is hereby corrected as shown below:

Column 6, lines 62-63, "polymer" instead of "polymber".

Signed and Sealed this

Twenty-second Day of March, 1988

Attest:

DONALD J. QUIGG

Attesting Officer

Commissioner of Patents and Trademarks